(12) United States Patent
Stella

(10) Patent No.: US 8,837,153 B2
(45) Date of Patent: Sep. 16, 2014

(54) POWER ELECTRONIC DEVICE HAVING HIGH HEAT DISSIPATION AND STABILITY

(75) Inventor: Cristiano Gianluca Stella, San Gregorio di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 167 days.

(21) Appl. No.: 13/534,201

(22) Filed: Jun. 27, 2012

(65) Prior Publication Data

US 2013/0003308 A1 Jan. 3, 2013

(30) Foreign Application Priority Data

Jun. 30, 2011 (IT) .............................. MI2011A1216

(51) Int. Cl.
*H05K 7/20* (2006.01)
*H01L 23/495* (2006.01)
*H01L 23/433* (2006.01)
*H01L 23/367* (2006.01)

(52) U.S. Cl.
CPC ...... *H01L 23/4334* (2013.01); *H01L 23/49575* (2013.01); *H01L 23/49562* (2013.01); *H01L 2924/09701* (2013.01); *H01L 2924/0002* (2013.01); *H01L 23/3672* (2013.01)
USPC ...... 361/710; 361/679.54; 361/704; 361/715; 165/80.2; 165/80.3; 165/104.33; 257/707; 257/706; 257/724

(58) Field of Classification Search
USPC ............... 361/679.46, 679.54, 704–712, 715, 361/719, 720, 760; 257/706–727, 675, 676, 257/E23.031, E21.575, E21.002; 165/80.2, 165/80.3, 104.33, 185; 174/15.1, 16.3; 438/121, 113, 108, 598
See application file for complete search history.

(56) References Cited

U.S. PATENT DOCUMENTS

| | | | |
|---|---|---|---|
| 4,147,889 A | 4/1979 | Andrews et al. | |
| 4,611,238 A | 9/1986 | Lewis et al. | |
| 4,748,538 A | 5/1988 | Tsuji | |
| 4,918,571 A | 4/1990 | Grabbe | |
| 5,311,395 A | 5/1994 | McGaha et al. | |

(Continued)

FOREIGN PATENT DOCUMENTS

| | | |
|---|---|---|
| EP | 0812015 A1 | 12/1997 |
| EP | 0948047 A2 | 10/1999 |

(Continued)

OTHER PUBLICATIONS

Italian Search Report and Written Opinion for IT MI2011A001216 mailed Feb. 21, 2012 (7 pages).

*Primary Examiner* — Michail V Datskovskiy
(74) *Attorney, Agent, or Firm* — Gardere Wynne Sewell LLP

(57) ABSTRACT

An insulating body embeds at least one integrated circuit chip and a first and second exposed heat sink exposed on a free surface opposite a mounting surface of the body. An external heat-sink extends above the free surface. The external heat-sink includes a first dissipative portion and a second dissipative portion for contacting the first and second heat-sinks on the free surface, respectively, as well as an insulating portion for electrically insulating the first dissipative portion from the second dissipative portion. The first dissipative portion and the second dissipative portion are symmetrical with respect to the insulating portion. An extension of the external heat-sink may provide a stabilizing element. The extension of the external heat-sink may alternatively thermally and electrically interconnect two insulating bodies, each body embedding at least one integrated circuit chip.

24 Claims, 11 Drawing Sheets

(56) References Cited

U.S. PATENT DOCUMENTS

| | | | |
|---|---|---|---|
| 5,504,652 A | 4/1996 | Foster et al. | |
| 5,977,630 A | 11/1999 | Woodworth et al. | |
| 6,054,759 A | 4/2000 | Nakamura | |
| 6,150,254 A | 11/2000 | Kito | |
| 6,707,676 B1 | 3/2004 | Geva et al. | |
| 6,833,997 B1 | 12/2004 | Jones, III et al. | |
| 7,145,224 B2 | 12/2006 | Kawashima et al. | |
| 7,286,361 B2 | 10/2007 | Yamanaka | |
| 7,746,650 B2 | 6/2010 | Hellinger et al. | |
| 7,776,658 B2 | 8/2010 | Liu et al. | |
| 7,816,784 B2* | 10/2010 | Son et al. | 257/707 |
| 7,851,908 B2* | 12/2010 | Otremba et al. | 257/724 |
| 7,892,893 B2 | 2/2011 | Obara | |
| 8,062,932 B2 | 11/2011 | Hebert et al. | |
| 8,154,108 B2 | 4/2012 | Liu et al. | |
| 8,358,017 B2 | 1/2013 | Tsui | |
| 8,390,041 B2 | 3/2013 | Yoshimochi | |
| 8,481,368 B2 | 7/2013 | Xue et al. | |
| 8,604,611 B2 | 12/2013 | Hauenstein | |
| 2005/0161785 A1 | 7/2005 | Kawashima et al. | |
| 2005/0280140 A1* | 12/2005 | Corbin et al. | 257/706 |
| 2006/0091512 A1 | 5/2006 | Shinohara | |
| 2007/0090523 A1 | 4/2007 | Otremba | |
| 2007/0108564 A1 | 5/2007 | Tang et al. | |
| 2007/0215996 A1 | 9/2007 | Otremba | |
| 2008/0054422 A1 | 3/2008 | Koike et al. | |
| 2009/0236732 A1* | 9/2009 | Yu et al. | 257/707 |
| 2009/0323288 A1* | 12/2009 | Bernard | 361/715 |
| 2010/0133674 A1 | 6/2010 | Hebert et al. | |
| 2011/0096509 A1 | 4/2011 | Yoshimochi | |
| 2013/0003305 A1 | 1/2013 | Stella | |
| 2013/0003308 A1 | 1/2013 | Stella | |
| 2013/0003311 A1 | 1/2013 | Privitera et al. | |
| 2013/0003312 A1 | 1/2013 | Stella et al. | |

FOREIGN PATENT DOCUMENTS

| | | |
|---|---|---|
| JP | 49047567 U | 4/1974 |
| JP | 58218149 A | 12/1983 |
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

* cited by examiner

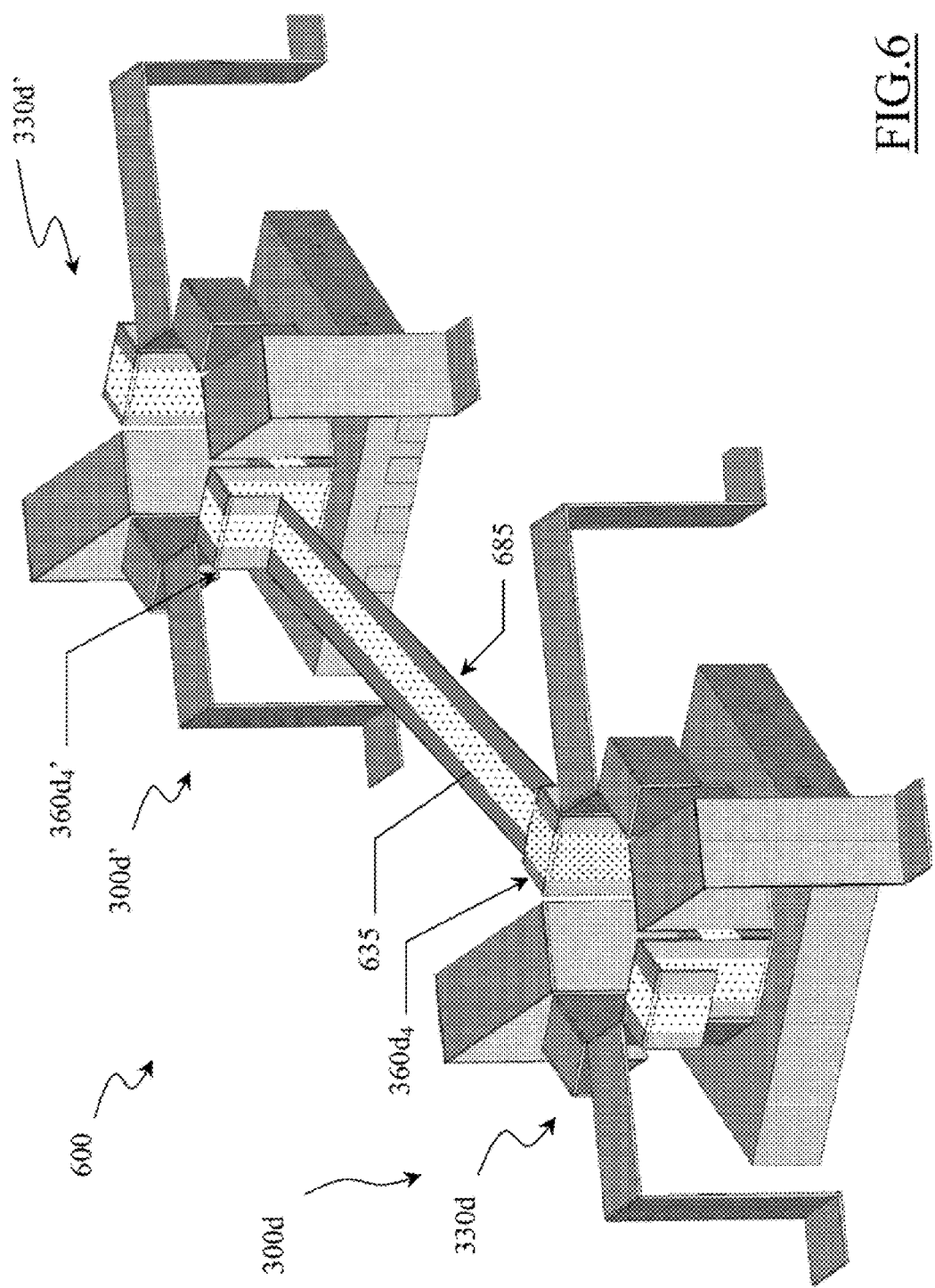

POWER ELECTRONIC DEVICE HAVING HIGH HEAT DISSIPATION AND STABILITY

PRIORITY CLAIM

This application claims priority from Italian Application for Patent No. MI2011A001216 filed Jun. 30, 2011, the disclosure of which is incorporated by reference.

TECHNICAL FIELD

The solution according to one or more embodiments of the present invention relates to the electronics field. More specifically, such solution relates to electronic devices for power applications (e.g., motor control and power supplies), or power devices.

BACKGROUND

Each power device typically comprises a chip of semiconductor material, on which one or more power components (e.g., power transistors—such as vertical structure MOS power transistors) are integrated, and a package wherein the chip is embedded for protecting it and allowing the access to terminals thereof.

As it is known, the power components, being affected by high voltages and/or high currents (of the order of 50-1500V and 0.1-8A, respectively), are subject to considerable heating during operation. For this reason, the power device needs a package that, for ensuring adequate heat dissipation properties (so as to avoid overheating phenomena to the chip that may cause malfunction or breakage), is equipped with one or more heat-sinks for dissipating to the outside the heat generated by the chip during operation thereof.

An example of such a package is represented by the package of the "DSC" ("Dual Side Cool") type, which is provided with two different heat-sinks. In particular, each power device with DSC package (or DSC power device) comprises a lower heat-sink that extends between a conductive region of the chip (e.g., a drain terminal of the power transistor) and a mounting surface of the package that, in use, typically faces towards a support (such as a printed circuit board—or PCB) on which the power device is mounted, and an upper heat-sink than extends between another conductive region of the chip (e.g., a source terminal of the power transistor) and a free surface of the package (typically opposite the mounting surface).

The power devices are typically used in switching circuits, for example for converting a direct voltage into an alternate voltage. A very widespread switching circuit is implemented by a full-bridge configuration, which generally comprises two pairs of power transistors in a half-bridge configuration for differentially driving a load; in particular, the power transistors of each pair are arranged in series, i.e. they are connected between a reference terminal, or ground, and a supply terminal (with a common terminal that usually defines a corresponding output terminal), whereas the two pairs of power transistors are arranged in parallel (i.e. they share the ground and supply terminals), with the load being connected between the respective output terminals.

A DSC power device is known in the art which comprises a single package within which two power transistors are housed (each one integrated on a respective chip) in half-bridge configuration (double-island DSC power devices), or an upper power transistor of the half-bridge (or upper transistor) and a lower power transistor of the half-bridge (or lower transistor). In general, in the double-island DSC power device the power transistors are in a mutually reversed configuration, i.e. the drain terminal of one of the two power transistors (for example, of the lower transistor) is connected together with the source terminal of the other power transistor (for example, the upper transistor) to the lower heat-sink (that usually acts also as a lead for accessing the output terminal), whereas the remaining source and drain terminals, respectively, are connected to corresponding mutually insulated upper heat-sinks.

In this way, compared to the traditional solutions wherein each power device comprises a package in which a single power transistor is housed, reduced size of the half-bridge are obtained, and thus more compactness and making simplicity of the corresponding switching circuit.

However, the double-island DSC power devices, as including two power transistors within them, are more affected by overheating problems.

In this regard, the use of auxiliary heat-sinks (for example, external to an insulating body of the package) for increasing heat dissipation from the chip could involve some drawbacks. In particular, to adopt (as the state of the art would suggest) two external heat-sinks each one mounted on a respective upper heat-sink (in order to avoid short-circuits between the terminals of the power transistors connected to such upper heat-sinks) would involve significant imbalances in the heat dissipation of the power transistors (due, for example, to inevitable manufacturing asymmetries and/or misalignment in the positioning of such external heat-sinks).

SUMMARY

In its general terms, the solution according to one or more embodiments presented herein is based on the idea of using a single external heat-sink having identical dissipative portions electrically insulated from each other.

In particular, one or more aspects of the solution according to specific embodiments are set out in the independent claims, with advantageous features of the same solution that are indicated in the dependent claims, whose wording is enclosed herein verbatim by reference (with any advantageous feature provided with reference to a specific aspect of the solution according to an embodiment that applies mutatis mutandis to any other aspect thereof).

More specifically, an aspect of the solution according to an embodiment proposes a system (for example, a power system) comprising a power device and a heat-sink external thereto). The system comprises an insulating body for embedding at least one chip of semiconductor material in which at least one electronic component is integrated (for example, two power transistors), the insulating body having a mounting surface for mounting the system on a board (for example, a printed circuit board or PCB), a first heat-sink connected to a conduction terminal of the at least one electronic component and a second heat-sink connected to a further conduction terminal of the at least one component insulated from the conduction terminal; the first heat-sink and the second heat-sink face on a free surface of the insulating body opposite the mounting surface for dissipating the heat generated by the chip towards the outside of the system. In the solution according to one or more embodiments, the system further comprises an external heat-sink extending above the free surface, the external heat-sink comprising a first dissipative portion and a second dissipative portion for contacting the first heat-sink and the second heat-sink on the free surface, respectively, and an insulating portion for electrically insulating the first dissipative portion from the second dissipative portion; the first dissipative portion and the second dissipative portion are symmetrical with respect to the insulating portion.

A further aspect of the solution according to an embodiment provides an electronic circuit comprising one or more of such systems.

A different aspect of the solution according to an embodiment provides a corresponding method for manufacturing the system.

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references and their explanation is not repeated for the sake of exposition brevity, and the name of each entity is in general used for indicating both type and attributes thereof—such as value, content and representation). In this respect, it is expressly understood that the figures are not necessarily drawn to scale (with some details that may be exaggerated and/or simplified) and that, unless otherwise indicated, they are simply used to conceptually illustrate the described structures and procedures. In particular:

FIGS. 5-6 show perspective schematic representations of possible implementations of a part of the electronic circuit of FIG. 4.

DETAILED DESCRIPTION OF THE DRAWINGS

Figure 1A:
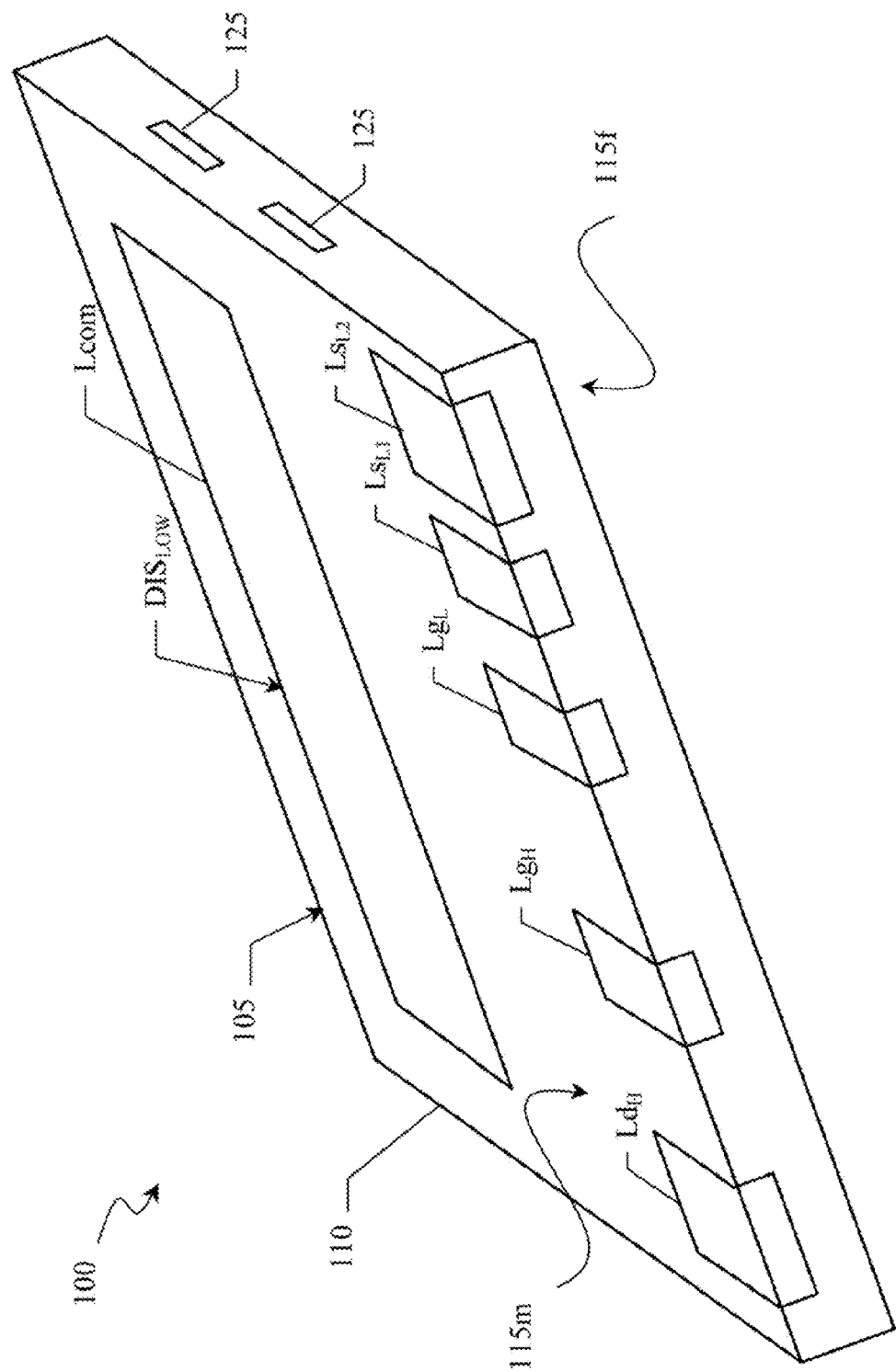
FIGS. 1A-1B show perspective schematic representations of an electronic device that can be used in the solution according to one or more embodiments.
Figure 1B:
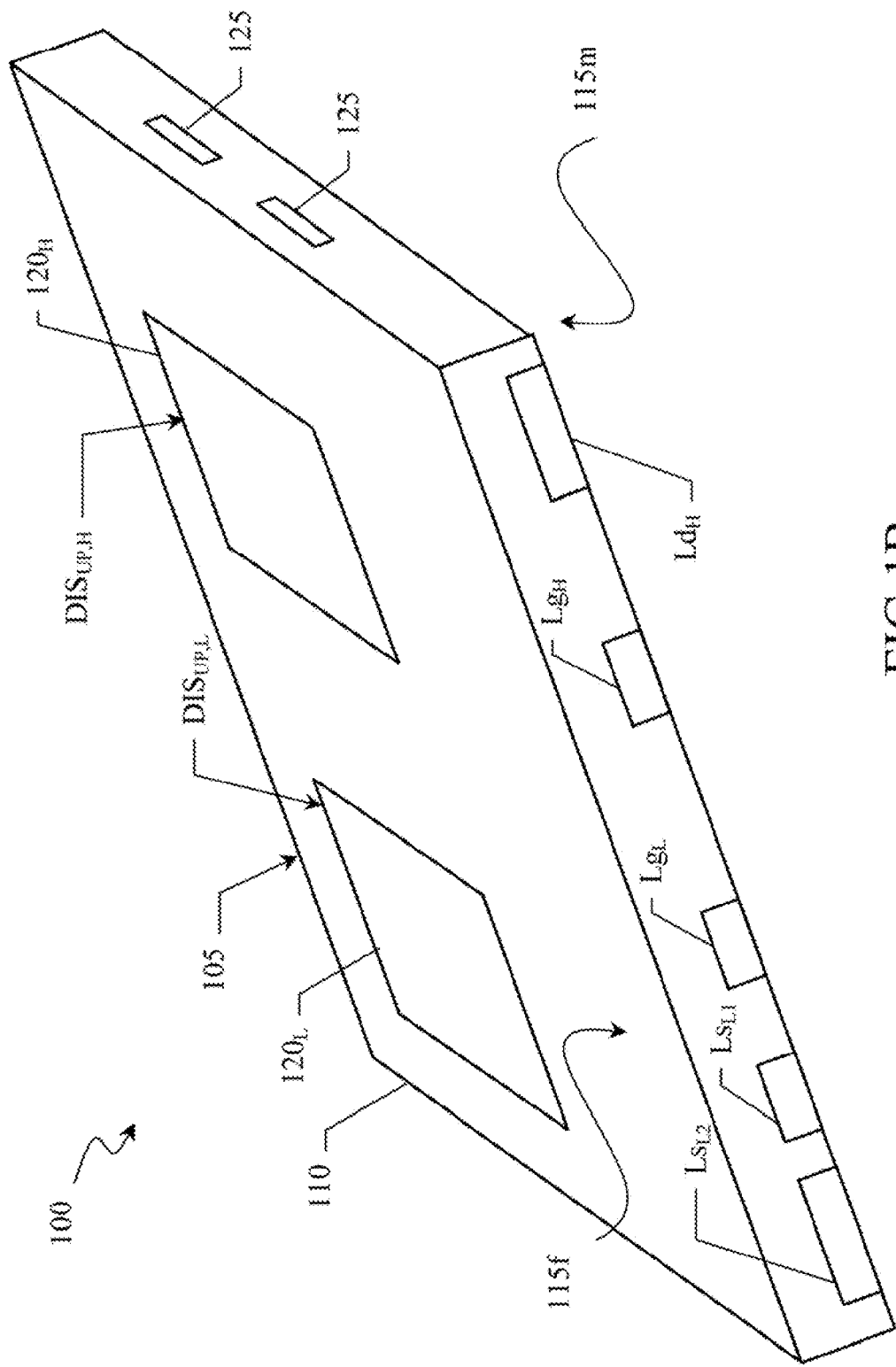

With reference to FIGS. 1A-1B, there is shown perspective schematic representations of an exemplary electronic device 100 that can be used in the solution according to one or more embodiments. More particularly, FIGS. 1A-1B show the same electronic device 100 overturned and non-overturned, respectively, with respect to a (typically, in use) mounting direction thereof.

In the exemplary but not limiting described embodiment, the electronic device 100 is an electronic device for power applications (for example, for controlling motors and for power supplies) or power device (for example, with operating voltages ranging from 5.5V and 850V). More particularly, such power device 100 comprises a chip of semiconductor material (not visible) on which two identical vertical-structure power transistors (e.g., of the MOS type) are integrated in half-bridge configuration (i.e., wherein an upper power transistor of the half-bridge and a lower power transistor of the half-bridge are connected in series thereby defining a common terminal).

The power device 100 comprises a package 105; the latter comprises an electrically insulating body 110 (e.g., of plastic material), generally parallelepiped-shaped, which embeds the chip for protecting it and at the same time for allowing the access to terminals thereof (e.g. drain terminals, source terminals and gate terminals of the lower transistor and upper transistor). Such package 105 is of the DSC ("Dual Cool Side") type, i.e. comprises heat dissipation elements for dissipating heat generated from the chip both towards a mounting surface 115$m$ of the package 105 (that, in use, is typically directed towards a printed circuit board or PCB, not shown), and towards a free surface 115$f$ of the package 105 (opposite the mounting surface).

From an implementation standpoint (where, for the sake of exposition brevity, only some aspects considered necessary for the purposes of this description will be generically discussed), the upper and lower power transistors are in a mutually reversed configuration within the power device 100; in particular, in the exemplary, not limiting, considered configuration, both the drain terminal of the lower transistor and the source terminal of the upper transistor face towards the mounting surface 115$m$, and are connected together (thereby forming the common terminal) to a lower heat-sink $DIS_{LOW}$, only an electrically conductive exposed pad $L_{COM}$ whereof is visible in FIG. 1A. Instead, the source terminal of the lower transistor and the drain terminal of the upper transistor both face towards the free surface 115$f$ and are connected each one to a corresponding upper heat-sink $DIS_{UP,L}$, $DIS_{UP,H}$, only the exposed pads 120$_L$ and 120$_H$ whereof are visible in FIG. 1B (which are properly spaced apart from each other by a proper distance).

The package 105 comprises a plurality of leads (six, in the exemplary illustrated embodiment) $Lg_L$, $Ls_{L1}$, $Ls_{L2}$, $Lg_H$, $L_{DH}$, $L_{COM}$, which are connected to respective terminals of the lower transistor and of the upper transistor and are adapted to allow the mounting of the power device 100 on the PCB through surface mounting technology.

In particular, the lead $L_{COM}$, generally rectangular-shaped, covers about one third of the mounting surface 115$m$, and is connected (within the package 105) to the common terminal; the lead $L_{COM}$, hence, acts both as a lead for accessing the common terminal and as a heat dissipation surface. Instead, the leads $Lg_L$ and $Ls_{L1}$, $Ls_{L2}$, and the leads $Lg_H$ and $Ld_H$, generally evenly arranged along one edge of the mounting surface 115$m$ opposite the lead $L_{COM}$, comprise each one a substantially square-shaped electrically conductive pad extending over a portion of the mounting surface 115$m$ and a portion of a side surface of the insulating body 110 adjacent thereto, and are electrically connected, within the package 105, to the gate terminal and to the source terminal of the lower transistor, and to the gate terminal and to the drain terminal of upper transistor, respectively.

The insulating body 110 also exposes free ends of electrically conductive tie-bars 125 (e.g., of metal material), which are used for supporting the lead $L_{COM}$ during production of the package 105 and are cut after molding of the insulating body 110; the tie-bars 125 are arranged in pairs on the other side surfaces of the insulating body 110 where there are not provided the leads $Lg_L$, $Ls_{L1}$, $Ls_{L2}$, $Lg_H$, $Ld_H$, $L_{COM}$. The leads $Lg_L$, $Ls_{L1}$, $Ls_{L2}$, $Lg_H$, $Ld_H$, $L_{COM}$ and the tie-bars 125 are properly spaced apart from each other so as to obtain a suitable creepage distance along the insulating body 110. For example, the creepage distances are equal to 1 mm between the lead $Lg_L$ and the lead $Ls_{L2}$, 2.7 mm between the lead $Lg_L$ and the lead $Lg_H$, 2.7 mm between the lead $Lg_H$ and the lead $Ld_H$, and 2 mm between the leads $Ls_{L1}$, $Ls_{L2}$, $Ld_H$, $Lg_L$, $Lg_H$ and the lead $L_{COM}$ (and the tie-bars 125), with the lead $Ls_{L1}$ and the lead $Ls_{L2}$ that are spaced apart from each other by 0.5 mm (although such values are merely indicative and no way limitative).

Figure 2:
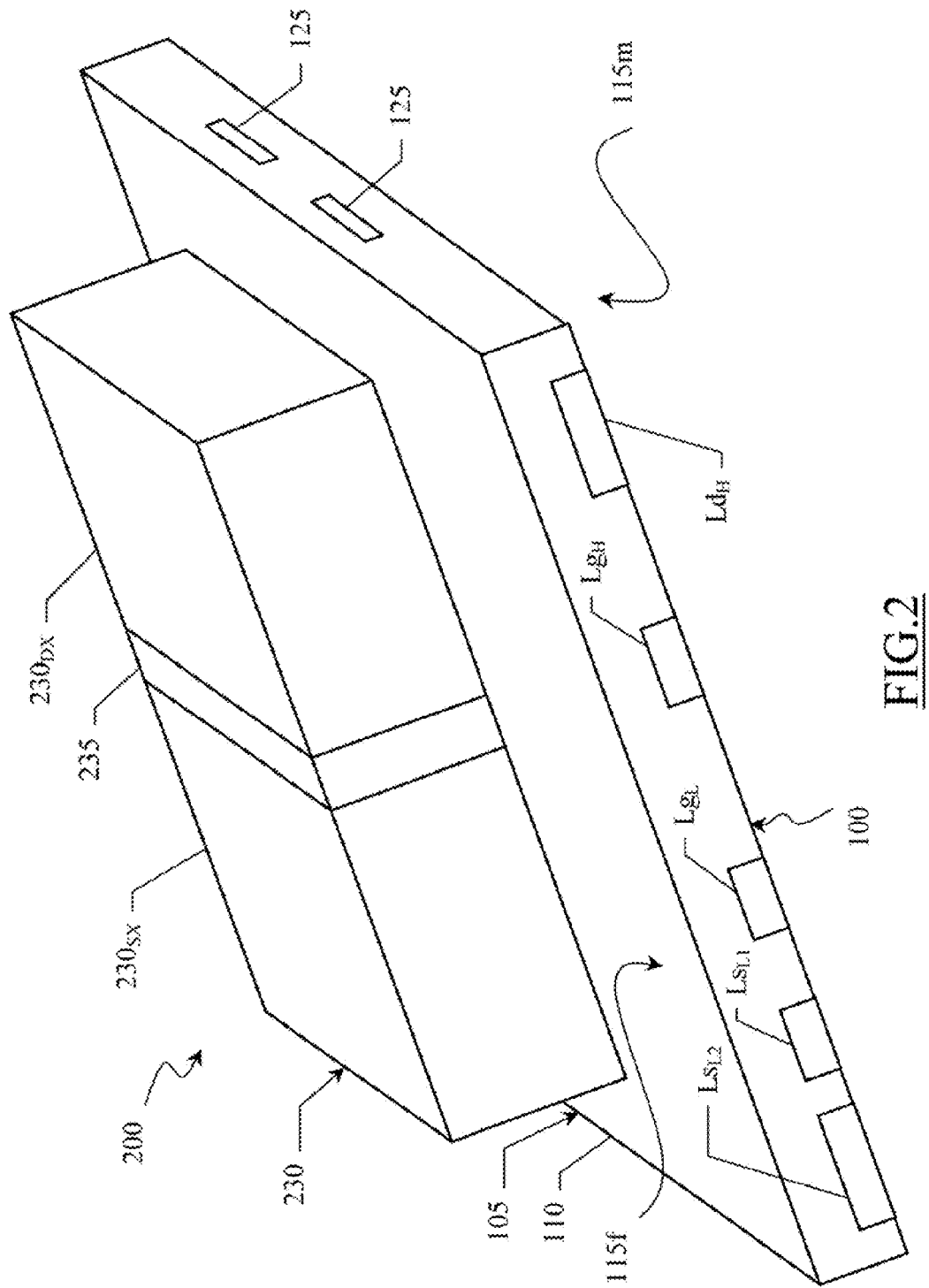
FIG. 2 shows a perspective schematic representation of a system according to the principles.

Turning to FIG. 2, there is shown a perspective schematic representation of a system 200. The system 200 comprises the power device 100 and, in addition, an external heat-sink 230 fixed on the pads 120$_L$ and 120$_H$ (not visible in the figure as completely covered by the heat-sink 230, see FIG. 1B) and extending in a portion of the volume above the free surface 115f.

The heat-sink 230 is fixed to the pads $120_L$ and $120_H$ through a fixing element (not shown in the figure), such as a thermal tape, a thermal paste or an epoxy resin (anyway, in general, not by welding, which could determine an uneven fixing—due, for example, to air bubbles trapped within the used weld material—and hence lower thermal conductivity between the heat-sink 230 and the pads $120_L$ and $120_H$).

The heat-sink 230 is illustrated as an element having a deliberately not defined structure, indicating that although in the following of the present description explicit reference will be made to specific advantageous configurations, the principles disclosed herein may be applied substantially to any type of heat-sink. Moreover, although in the following explicit reference will be made to the external heat-sink mounted on the power device 100 (i.e., a double-island DSC power device), this should not be understood in a restrictive way, since it can be mounted on any electronic device. In addition, it is outlined that the described solution may be also applied to a package/heat-sink system apt to be marketed without the chip, which chip may then be placed within the package at a later time by the buyer.

The heat-sink 230 comprises an insulating portion 235 (e.g., made of glass, porcelain, ceramic materials—for example, based on boron nitride, which has high electrical insulation properties and high property of heat conduction) along an axis of symmetry thereof, which defines a dissipative portion $230_{SX}$ (of conductive material) of the heat-sink 230 and another dissipative portion $230_{DX}$ analogous to the dissipative portion $230_{SX}$ and symmetrical with respect to the latter; in other words, the dissipative portions $230_{SX}$ and $230_{DX}$ are mutually symmetrical with respect to the insulating portion 235.

The heat-sink 230 is mounted on the free surface 115f so that the dissipative portions $230_{SX}$ and $230_{DX}$ are electrically connected to the pads $120_H$ and $120_L$, respectively, and aligned in the same way to them (and hence to the upper and lower transistors). In this way, being the insulating portion 235 at a central position (on the portion of the free surface 115f) between the pad $120_L$ and the pad $120_H$, short-circuits between the drain terminal of the lower transistor and the source terminal of the upper transistor are avoided. Moreover, in such way, the upper and lower transistors experience a same thermal conductivity, as associated with identical, symmetrical dissipative portions $230_{DX}$ and $230_{SX}$. In other words, the dissipative portions $230_{SX}$ and $230_{DX}$ are electrically independent from each other (as being insulated from each other by the insulating portion 235), but are structurally and thermally interconnected (as being part of a single component, thermally non-insulated from its dissipative portions $230_{SX}$ and $230_{DX}$, i.e. the heat sink 230).

Therefore, the described solution allows using a single external heat-sink (instead of two different heat-sinks, easily subject to phenomena of mutual misalignment that could cause non-negligible asymmetries in the heat dissipation and system stability issues), thereby preventing short-circuits between the terminals of the power transistors.

Turning now to FIGS. 3A-3E, they show perspective schematic representations of corresponding exemplary implementations of the system of above (hereinafter, similar elements will be denoted by using same number references and distinguished by the subscripts a, b, c, d, e, respectively).

Figure 3A:
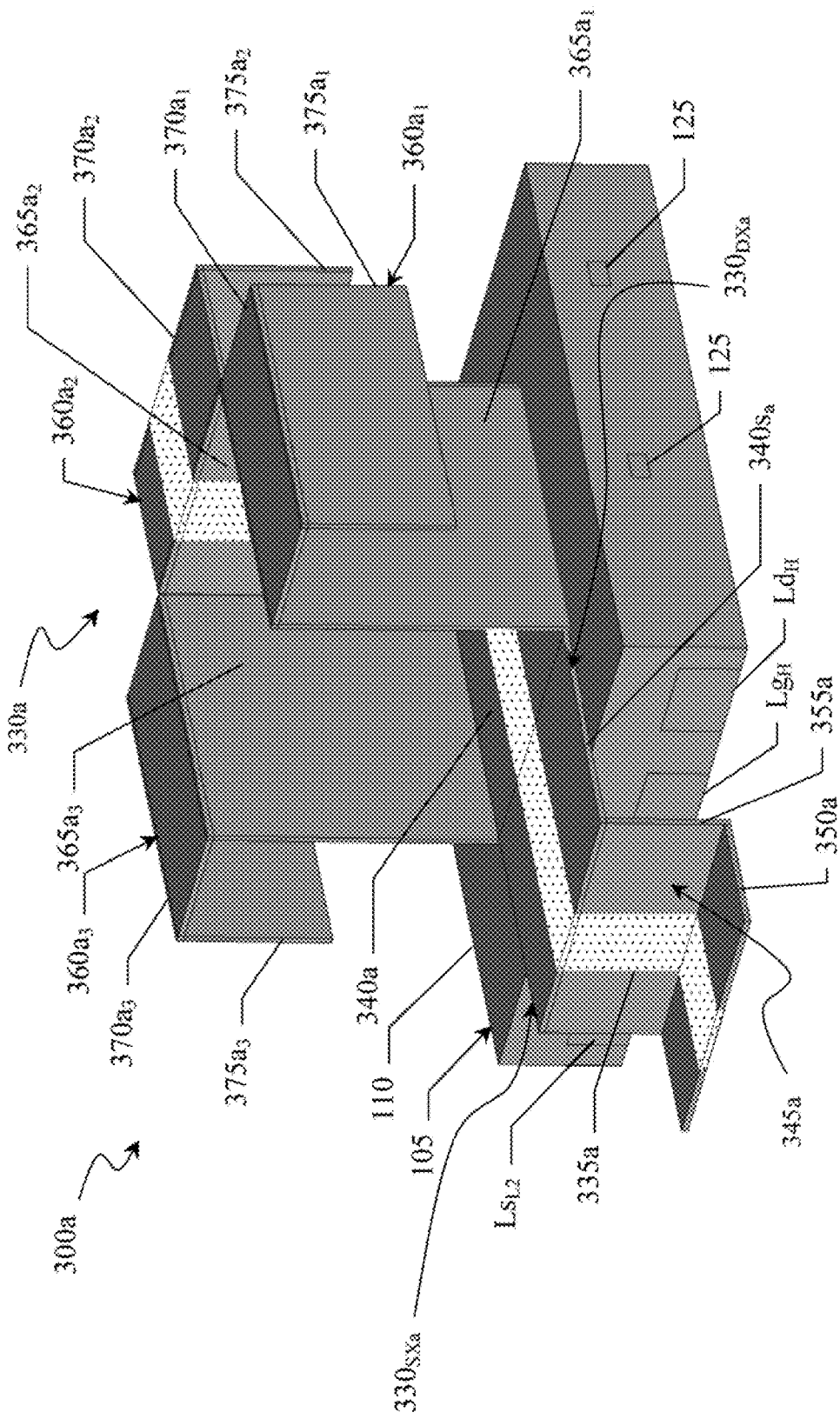
FIGS. 3A-3E show perspective schematic representations of corresponding exemplary implementations of the system of FIG. 2.

In the system 300a, illustrated in FIG. 3A, the heat-sink 330a comprises a (generally square-shaped) base 340a, mounted on the pads $120_L$, $120_H$ (and on part of the insulating body 110), and a stabilizing element 345a folded on the PCB (not shown). More particularly, such stabilizing element 345a comprises a protruding portion $340s_a$, parallel to the free surface 115f, which extends from an edge of the base 340a beyond a contour of the insulating body 110 (e.g., for a safety distance sufficient to prevent short-circuits between the stabilizing element 345a and the leads $Ls_{L1}, Ls_{L2}, Ld_H, Lg_L, Lg_H$), a mounting portion (tab) 350a, parallel to the free surface 115f, which contacts the PCB at a distance from the package 205 (on the PCB) equal to such safety distance, and an intermediate portion 355a, transverse to the free surface 115f, which extends vertically from an end of the protruding portion $340s_a$ towards the tab 350a.

In the proximity of the other three edges of the base 340a (where the stabilizing element 345a is not provided), corresponding fins $360a_1, 360a_2, 360a_3$ extend substantially transversal to the free surface 115f (moving away from the insulating body 110, upwards in the figures) for transferring the heat to the external of the power device 100. Each fin $360a_1, 360a_2, 360a_3$ comprises, in succession from the base 340a, a proximal portion $365a_1, 365a_2, 365a_3$, a distal portion $370a_1, 370a_2, 370a_3$ and an end portion $375a_1, 375a_2, 375a_3$. In greater detail, the proximal portion $365a_1, 365a_2, 365a_3$ extends from the base 340a transversally to the free surface 115f, the distal portion $370a_1, 370a_2, 370a_3$ is bent outward so as to be parallel to the free surface 115f, and the end portion $375a_1, 375a_2, 375a_3$ is folded so as to be parallel to the proximal portion $365a_1, 365a_2, 365a_3$ (hence transversal to the free surface 115f) and extend towards the insulating body 110 (i.e., downward in the figures).

The insulating portion 335a of the heat-sink 330a defines the two dissipative portions $330_{SXa}$ and $330_{DXa}$ related to the lower transistor and to the upper transistor, respectively. More specifically, such insulating portion 335a crosses the base 340a, the stabilization element 345a and the fin facing the latter (i.e., the fin $360a_2$) so as to obtain dissipative portions $330_{SXa}$ and $330_{DXa}$ symmetric and electrically (but not mechanically and thermally) insulated, with the same advantages discussed above.

In addition, the stabilizing element 345a provides a good mechanical stability of the heat-sink 330a (which mechanical stability may be further improved through the use of double-sided tapes between the tab 350a and the PCB) and allows releasing at least partially the weight directly on the PCB; in this way, the pressure exerted by the heat-sink 330a on the insulating body 110 is reduced, thus avoiding deteriorations, or breakage, of contacts between the leads $Lg_L, Ls_{L1}, Ls_{L2}, Lg_H, Ld_H$ and the conductive tracks of the PCB.

Moreover, the stabilizing element 345a helps to dissipate heat both to the external environment by convection and to the PCB by conduction, hence the system 300a, as well as being mechanically and electrically more reliable, has high heat dissipation properties.

Figure 3B:
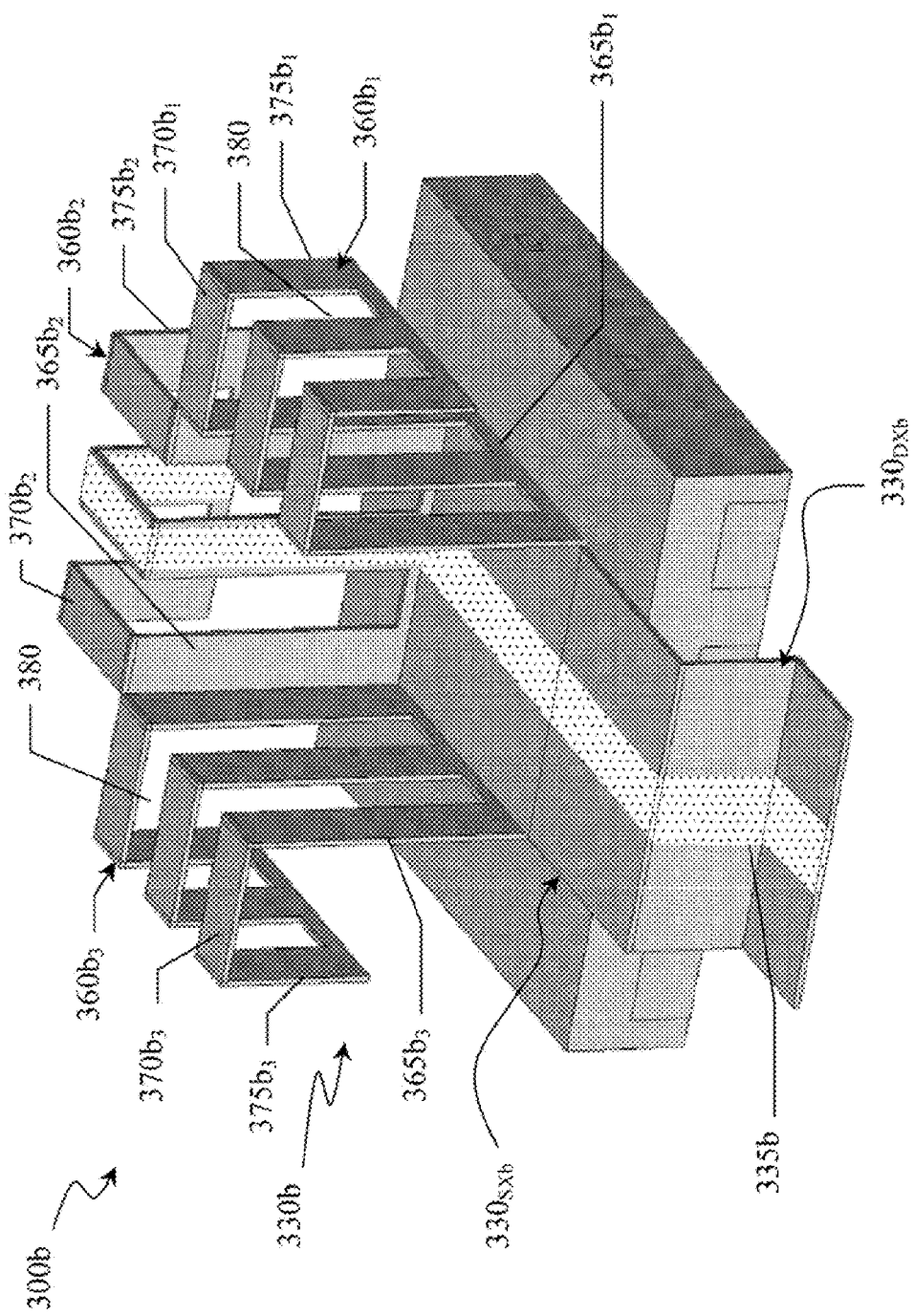

In the system 300b, shown in FIG. 3B, the heat-sink 330b comprises fins $360b_1, 360b_2, 360b_3$ wherein the proximal portion $365b_1, 365b_2, 365b_3$, the distal portion $370b_1, 370b_2, 370b_3$, and the end portion $375b_1, 375b_2, 375b_3$ are obtained from the proximal portion $365a_1, 365a_2, 365a_3$, from the distal portion, $370a_1, 370a_2, 370a_3$ and the end portion $375a_1, 375a_2, 375a_3$, respectively, by making one or more (two, in the illustrated example) openings 380 on each one of them; in the exemplary illustrated embodiment, such openings 380 are equidistant from each other and are substantially rectangular-shaped (although this should not be understood in a restrictive way).

Such implementation is particularly advantageous when it is necessary to obtain greater heat exchange by convection rather than by conduction (for example, in applications wherein the power device is operative for long periods of time, e.g. of the order of hours or days); in fact, the increase of the perimeter of the heat-sink $330b$, due to the openings $380$, allows a greater air circulation between the fins $360b_1$, $360b_2$, $360b_3$ with respect to the fins $360a_1$, $360a_2$, $360a_3$.

Figure 3C:
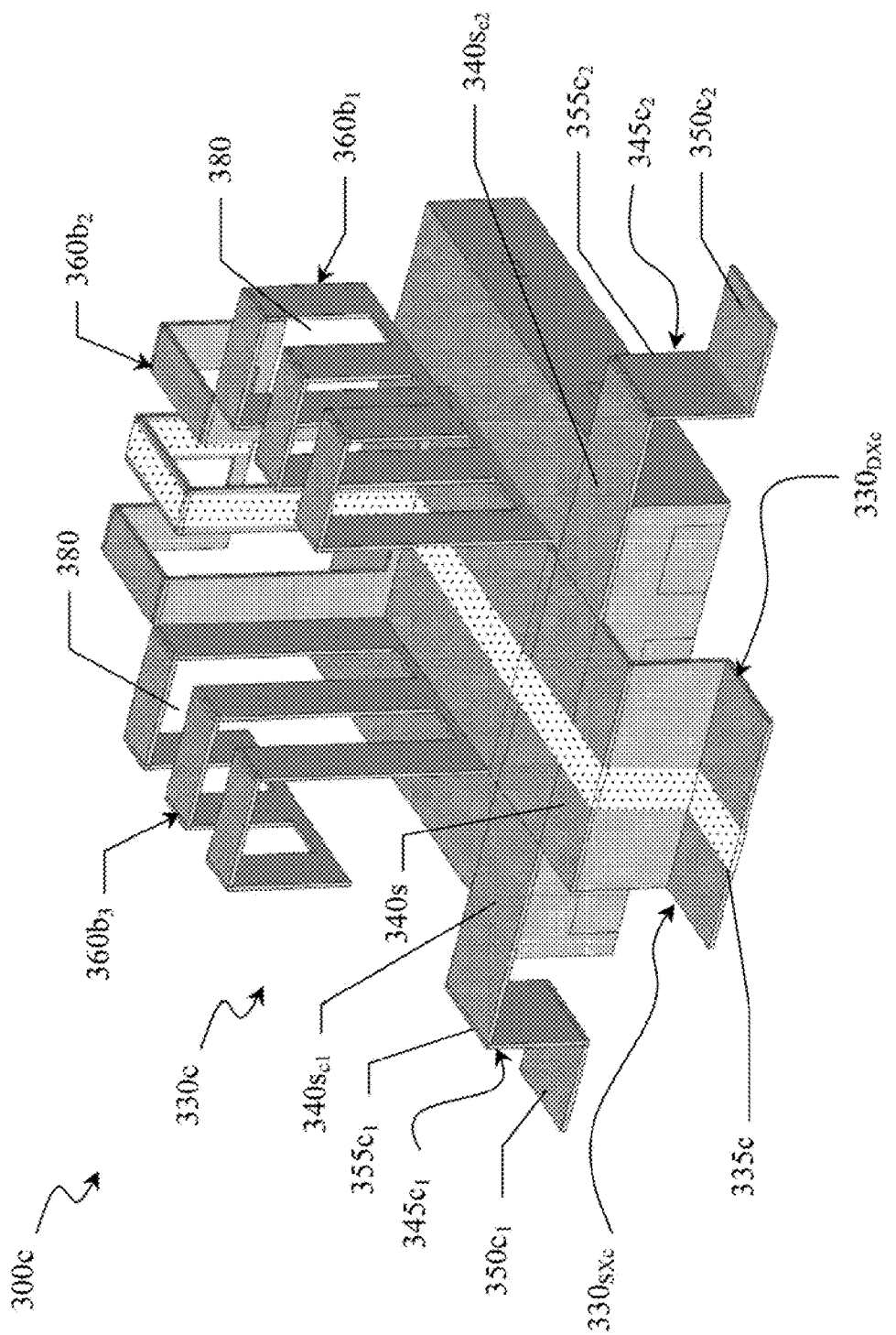

In the system $300c$, shown in FIG. 3C, the heat-sink $330c$ is substantially analogous to the previous one. With respect to the latter, the heat-sink $330c$ comprises two further identical stabilizing elements $345c_1$, $345c_2$ facing towards opposite side faces of the insulating body $110$. As visible in the figure, such stabilizing elements $345c_1$ and $345c_2$ are structurally analogous to the stabilizing element $345a$ (but may have different size with respect to the latter), i.e. comprise the protruding portion $340s_{c1}$, $340s_a$, the intermediate portion $355c_1$, $355c_2$ and the tab $350c_1$, $350c_2$. The protruding portion $340s_{c1}$, $340s_{c2}$ of each stabilizing element $345c_1$, $345c_2$ is connected orthogonal to the protruding portion $340s_a$, whereas the tabs $350c_1$, $350c_2$ are mutually symmetrical with respect to the latter.

Thanks to the stabilizing elements $345c_1$ and $345c_2$, the heat-sink $330c$ allows obtaining improved stability and robustness with respect to the previous solutions.

It should be noted that although the system $300c$ has been described as a variant of the system $300b$, this does not exclude that the stabilizing elements $345c_1$ and $345c_2$ can be made also in the system $300a$.

Figure 3D:
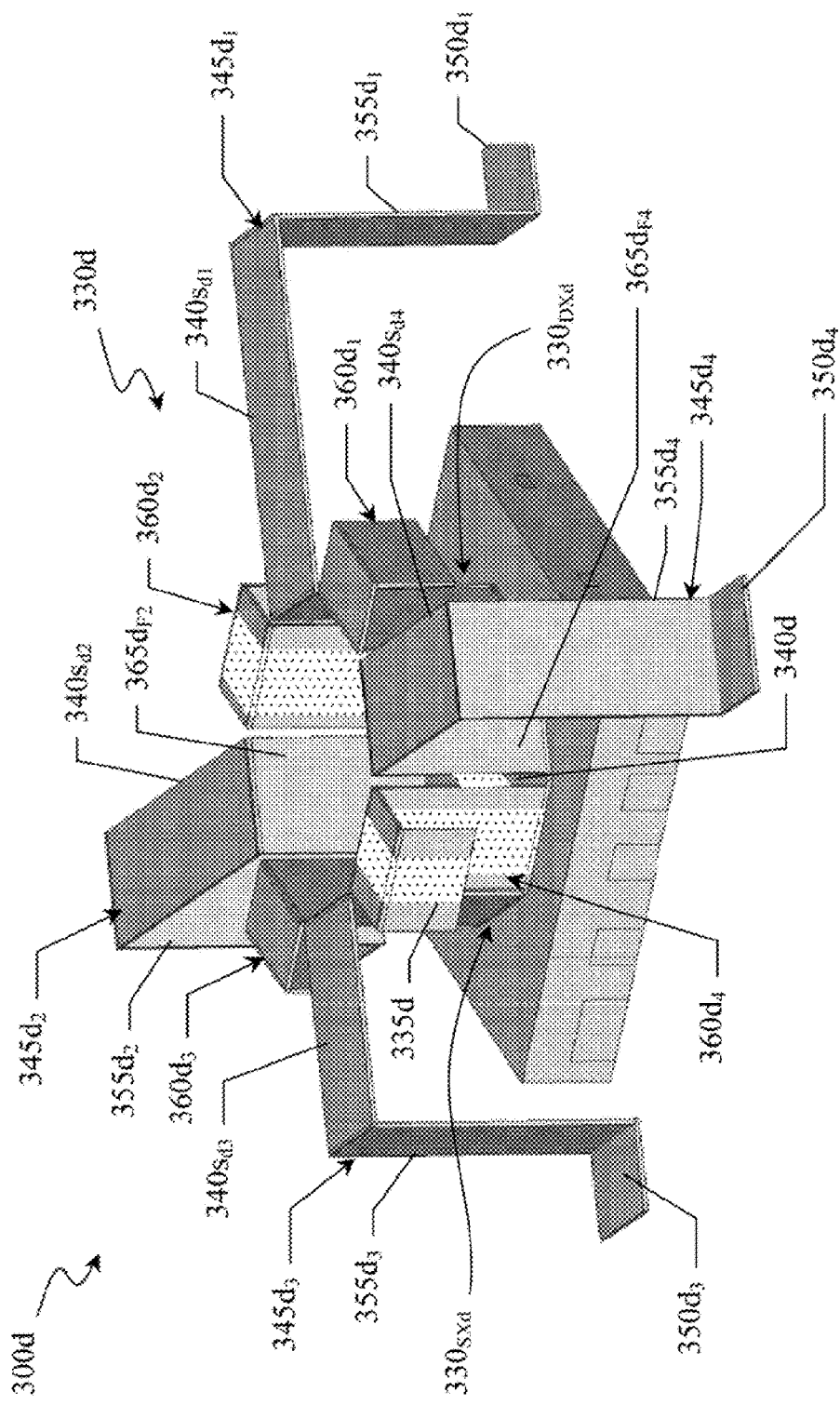

In the system $300d$, shown in FIG. 3D, the heat-sink $330d$ comprises a substantially octagonal-shaped base $340d$, and a plurality (four in the embodiment shown in the figure) of fins $360d_1$, $360d_2$, $360d_3$, $360d_4$ similar to the solid fins $360a_1$, $360a_2$, $360a_3$ each one extending on a corresponding side along a perimeter of the base $340d$. In particular, the fins $360d_1$, $360d_2$, $360d_3$, $360d_4$ of the exemplary illustrated embodiment are arranged along the perimeter so that the corresponding end portions (not numbered for the sake of simplicity) are substantially parallel each one to a respective one of the four side surfaces of the insulating body $110$.

The heat-sink $330d$ also comprises four stabilizing elements $345d_1$, $345d_2$, $345d_3$ and $345d_4$ that extend from sides of the perimeter of the base $340d$ so as to be alternate to the fins $360d_1$, $360d_2$, $360d_3$ and $360d_4$, respectively.

Preferably, although not necessarily, the stabilizing elements $345d_1$, $345d_2$, $345d_3$, $345d_4$ are arranged in facing pairs; as visible in the figure, each stabilizing element $345d_1$, $345d_2$, $345d_3$, $345d_4$ comprises (in succession from the base $340d$) another proximal portion $365d_{F1}$, $365d_{F2}$, $365d_{F3}$, $365d_{F4}$ (similar to the proximal portion of the fins $360d_1$, $360d_2$, $360d_3$, $360d_4$, respectively), a portion $340s_{d1}$, $340s_{d2}$, $340s_{d3}$, $340s_{d4}$ protruding beyond the contour of the insulating body $205$, a tab $350d_1$, $350d_2$, $350d_3$, $350d_4$ contacting the PCB, and an intermediate portion $355d_1$, $355d_2$, $355d_3$, $355d_4$, transversal to the free surface $115f$, which extends vertically from the end of the protruding portion $340s_{d1}$, $340s_{d2}$, $340s_{d3}$, $340s_{d4}$ towards the tab $350d_1$, $350d_2$, $350d_3$, $350d_4$.

It should be noted that such implementation, similarly to the previous ones, is designed so that the heat-sink $330d$ is formed by two dissipative portions $330_{SXd}$ $330_{DXd}$ being symmetrical with respect to the insulating portion $335d$.

The described solution is advantageous since the stabilizing elements $345d_1$, $345d_2$, $345d_3$ and $345d_4$ provide further improved mechanical stability and heat dissipation capability to the heat-sink $330d$.

Figure 3E:
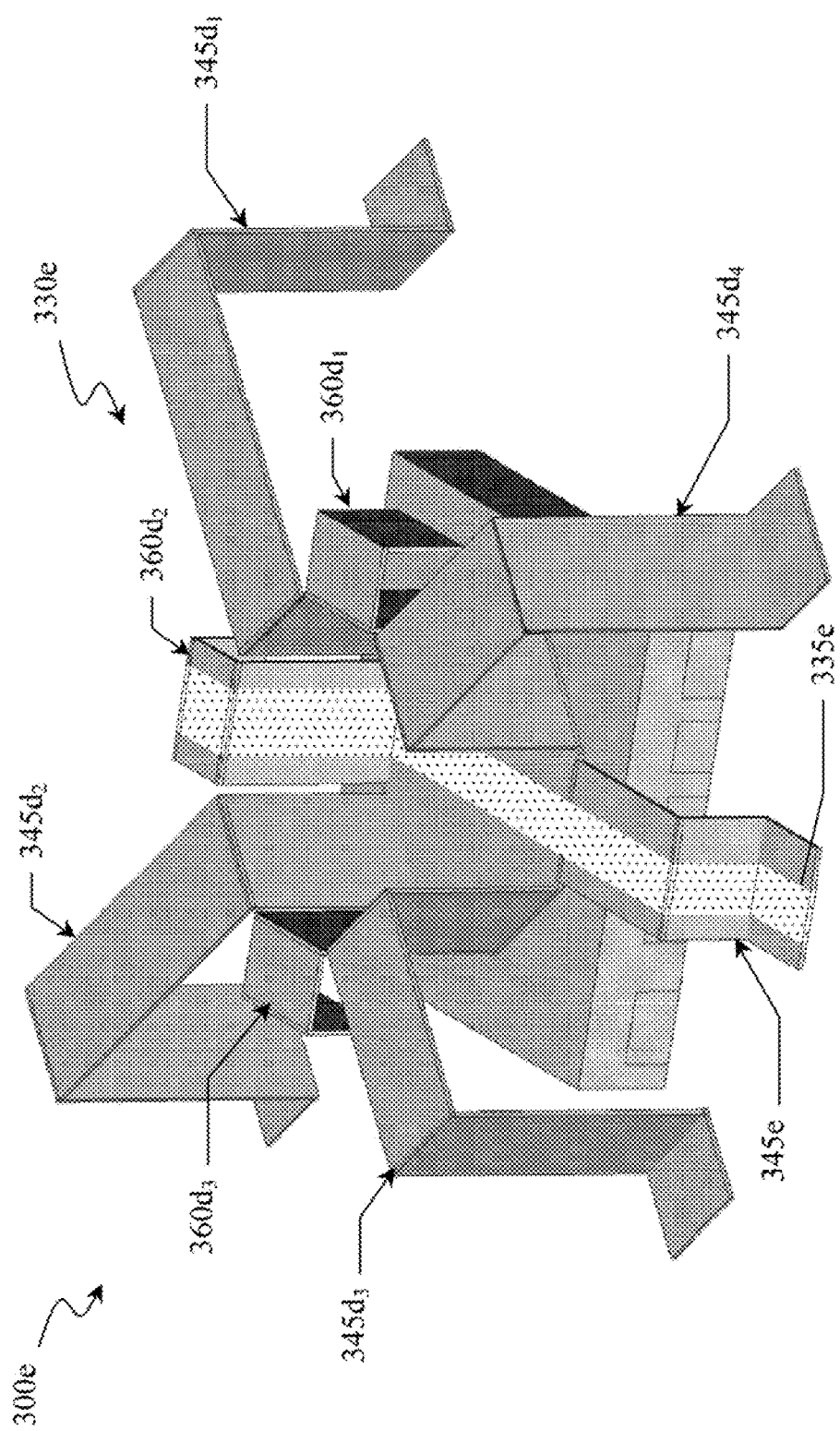

The system $300e$, shown in FIG. 3E, comprises a heat-sink $330e$ similar to the previous one, but with respect to the latter comprises three instead of four fins, i.e. the fins $360d_1$, $360d_2$, $360d_3$, and a stabilizing element $345e$. The stabilizing element $345e$ is analogous to the stabilizing element $345a$, and replaces the fin that in the power device $330d$ faces towards the side surface of the insulating body $205$ from which the leads $Lg_L$, $Ls_{L1}$, $Ls_{L2}$, $Lg_H$, $Ld_H$ expose (i.e., the fin $360d_4$ in FIG. 3D).

In other embodiments (not shown in the figures), it is also possible to provide openings also within the stabilizing elements (so as to increase the heat dissipation by convection), or make arched stabilizing elements.

In further embodiments, also not shown, at least one between the stabilizing elements $345a$, $345d_1$, $345d_2$, $345d_3$, $345d_4$, and/or the further stabilizing elements $345c_1$, $345c_2$ may be configured to pass through the PCB and fixed to it by means of a through mounting technique (by appropriate through holes or slots of the PCB).

It should be noted that the heat-sinks $330a$-$330e$ described above and those having reference thereto can be obtained by a molding process of a foil of thermally conductive material (e.g., an aluminum foil), followed by a folding phase of such molded foil. Accordingly, since such heat-sinks $330a$-$330e$ can be produced in large amounts with low costs and with relatively simple production equipments, the corresponding systems $300a$-$300e$ do not involve making difficulties.

Figure 4:
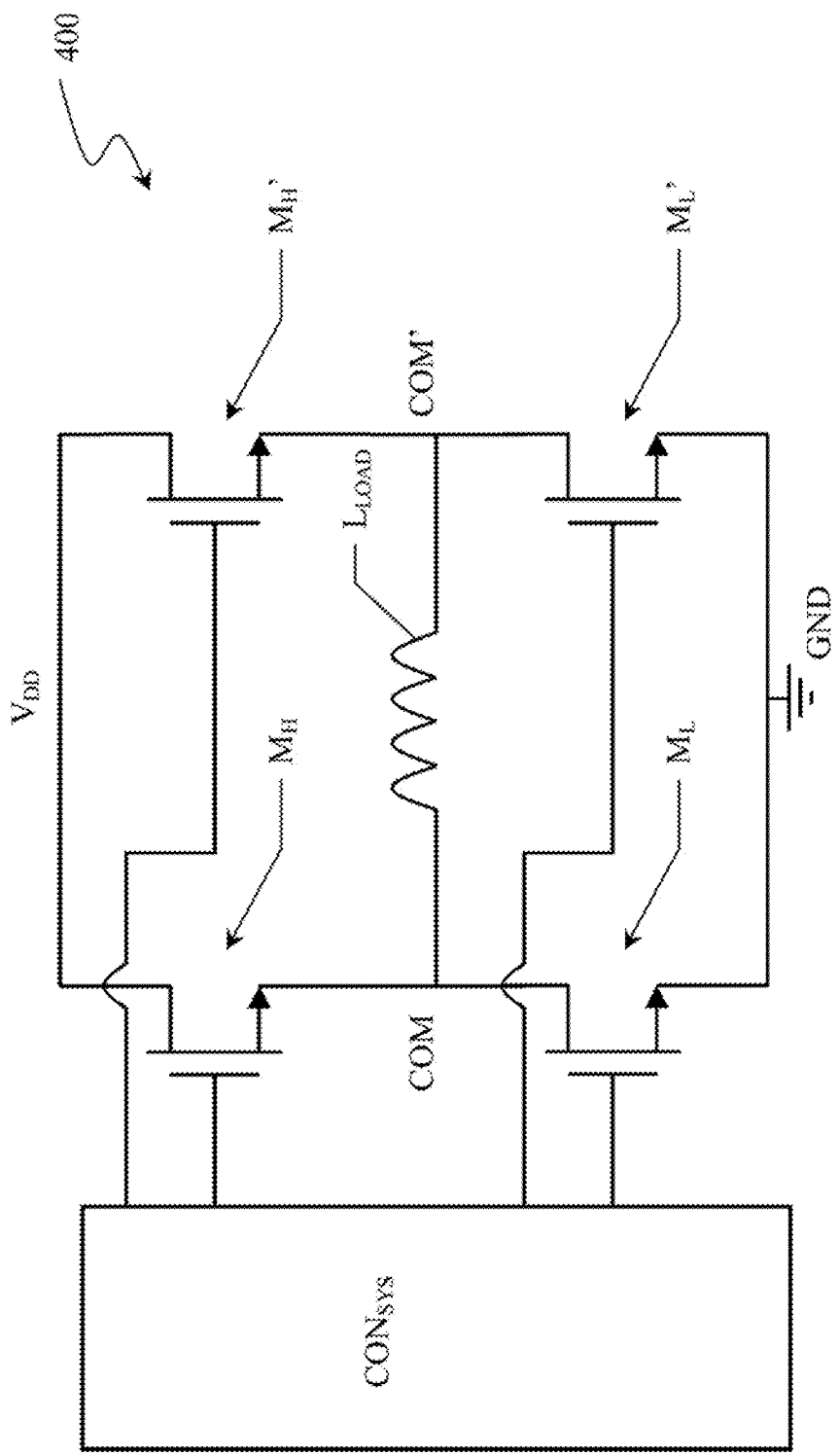
FIG. 4 shows an exemplary electronic circuit that can be implemented by the solution according to one or more embodiments.

Turning now to FIG. 4, it shows an electronic circuit (in the specific case a switching circuit, which will be referred to in the following by way of non-limiting example) $400$ that can be implemented by the solution according to one or more embodiments.

The switching circuit $400$ has a full-bridge structure, with two circuit branches each one formed by a lower power transistor $M_L$, $M_L'$ and a higher power transistor $M_H$, $M_H'$ (for example, both of the N-channel MOS type), which are connected to each other in half-bridge configuration.

In each half-bridge, the source terminal of the lower transistor $M_L$, $M_L'$ is connected to a reference terminal GND (which receives a reference voltage, or ground), whereas the drain terminal of the higher transistor $M_H$, $M_H'$ is connected to a power supply terminal $V_{DD}$ (which provides a direct supply voltage—for example, 600-900V with respect to the ground voltage); the drain terminal of the lower transistor $M_L$, $M_L'$ and the source terminal of the higher transistor $M_H$, $M_H'$ are connected together thereby defining the corresponding common terminal COM, COM', between which a (e.g., inductive) load $L_{LOAD}$ is connected.

The gate terminal of each transistor $M_L$, $M_H$, $M_L'$, $M_H'$ may be connected to a control system $CON_{SYS}$, which generally controls the transistors $M_L$, $M_H$, $M_L'$, $M_H'$ so that each pair formed by the lower transistor $M_L$, $M_L'$ of a half-bridge and the higher transistor $M_H$, $M_H'$ of the other half-bridge is turned on and off alternately.

As should be understood, the switching circuit $400$ can be conceptually obtained by using two identical systems among those described above (or that can have reference thereto), properly connected to each other.

Figure 5:
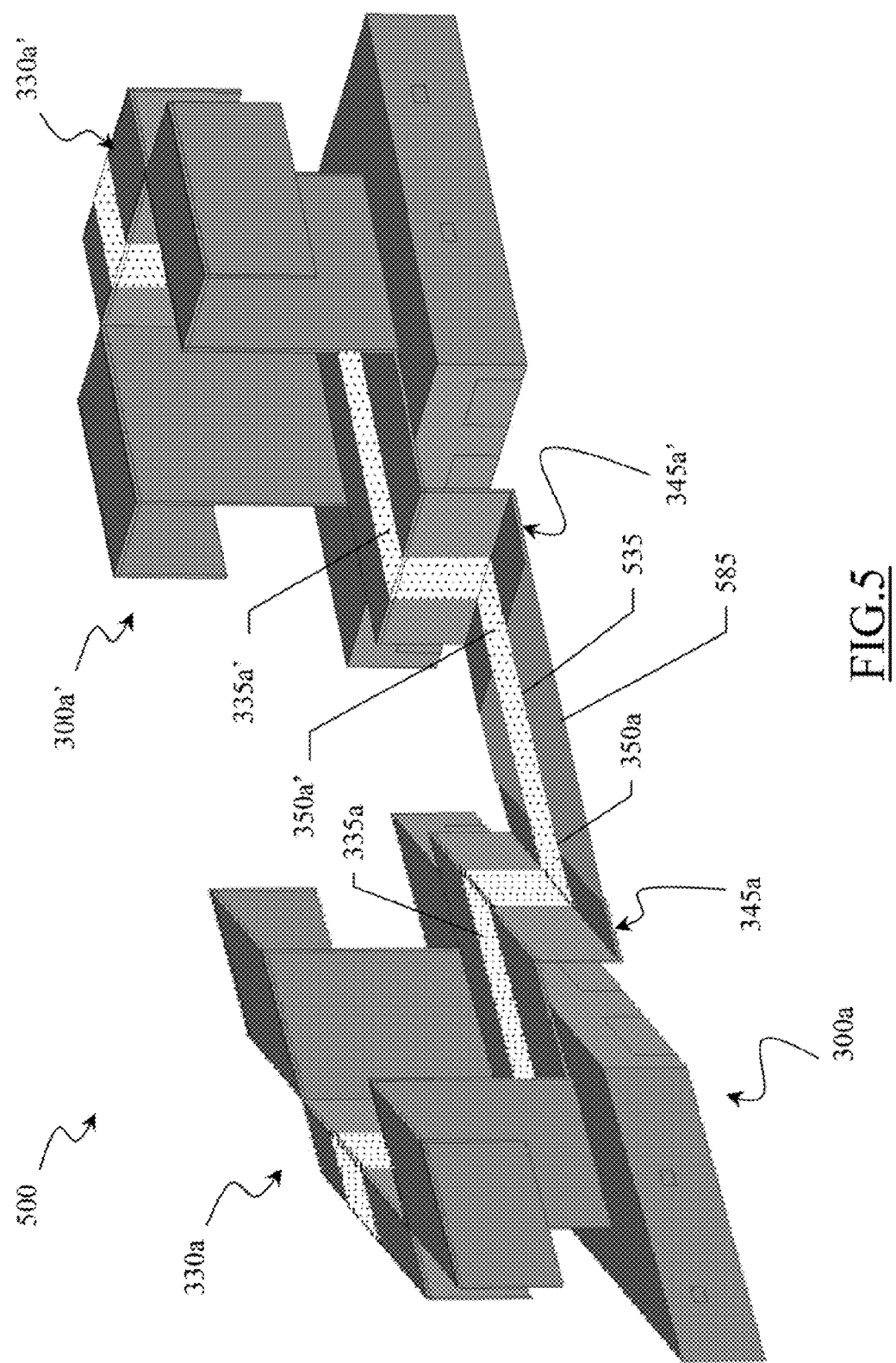

By way of example, with reference to FIGS. 5-6, they show perspective schematic representations of corresponding implementations of a part of the switching circuit $400$ (i.e., only of the transistors of the bridge) according to embodiments based on two exemplary system typologies.

In particular, the implementation $500$, shown in FIG. 5, comprises the system $300a$ for implementing the half-bridge $M_L$, $M_H$, and another identical system for implementing the half-bridge $M_L'$, $M_H'$, denoted by the number reference $300a'$ (as well as for the constitutive elements thereof) for differentiating it from the former.

The implementation further comprises a connection element 585 for connecting, on the PCB (e.g., through a thermal tape, thermal mixture, epoxy resin), the tab 350a and the tab 350a'. Such connection element 585, having the same width of the tab 350a, 350a' and length equal to the distance on the PCB between the tab 350a and the tab 350a', has a central insulating portion 535 connecting the insulating portion 335a of the heat-sink 330a and the insulating portion 335a' of the heat-sink 330a'.

In this way, the implementation 500 has a high symmetry degree; in fact, in functional terms (but possibly also in structural terms, as will be clarified in the following), it comprises a single external composite heat-sink 330a, 330a', 585 symmetrical with respect to the insulating portion 335a, 335a', 535 thereof, solution that ensures that the upper transistors $M_H$, $M_H'$ of each half-bridge are electrically and thermally connected to each other, but electrically (but not thermally) insulated from the corresponding lower transistors $M_L$, $M_L'$ (which are electrically and thermally connected to each other too).

This ensures to the implementation 500 the same advantages in terms of mechanical stability and heat dissipation above discussed in relation to the single systems.

Instead, the implementation 600, illustrated in FIG. 6, comprises, as above, two identical systems, in this exemplary case the systems 300d and 300d'.

The systems 300d, 300d' are mounted on the PCB so as to have the leads being faced. In the exemplary illustrated embodiment, the fins $360d_4$, $360d_4'$, which thus face to each other, are connected to each other by a further connection element 685 (although further or alternative connection elements, not shown, e.g. between the stabilizing elements $345d_1$, $345d_2$, $345d_3$, $345d_4$ and the stabilizing elements $345d_1'$, $345d_2'$, $345d_3'$, $345d_4'$, are not excluded).

As previously mentioned, the composite heat-sink 330d, 330d', 685 may be also obtained monolithically, thanks to the consolidated molding process above described. As a consequence, such implementations may be obtained in an extremely simple and versatile way, in large amounts, and with low costs.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

In particular, analogous considerations apply if the electronic device and/or the system has a different structure or comprises equivalent components. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries. For example, the electronic device may comprise different chips, into each of which any component, electronic circuit, and/or electronic module (not necessarily of the power type) may be integrated.

In general, the electronic device may comprise a greater number of transistors, each one of which may be associated with a corresponding upper heat-sink. In such configuration, the external heat-sink may have a greater number of identical dissipative portions (one for each transistor/heat-sink).

The end portion of the stabilizing elements could be formed such as to be substantially transversal to the board and fixed to the latter at and end thereof (or such as to pass through it partly or totally).

The number and the direction of the stabilizing elements illustrated in the figures is not limitative, as it can be chosen according to design parameters (anyway, meeting creepage and clearance distances for a safe operation of the electronic device).

The external heat-sink may be formed with any number of fins, or at the limit it may be lacking of it. Alternatively, fins may be provided above the base of the external heat-sink or differently-shaped (e.g., truncated conical shaped) elements configured for increasing the heat dissipation by convection may be provided.

Nothing avoids forming the fins with different folding (for example, with the end portion formed such as to extend in the direction opposite the free surface); moreover, the folding could not be provided (with fins simply transversal to the free surface), or could be in a different number (for example, only one folding, or more than two folding).

Although not explicated in the description the external heat-sink should be properly arranged on the electronic device according to specific design parameters to be met. For example, the portion $230_{SX}$ should be positioned such as each part thereof (i.e., the base, the fins and the stabilizing elements of the portion $230_{SX}$) is placed at least at a first creepage distance (for example, of the order of millimeters) from each corresponding gate lead, and at least at a second surface distance from the tie bars (for example, again of the order of millimeters and however greater than the first creepage distance, since during operation the tie bars are typically biased at the same voltage of the drain lead, the latter being higher than the voltage of the gate lead to prevent the occurrence of surface electric discharges along the surfaces of the insulating body and/or the PCB). In addition, the heat-sink should comply with a first clearance distance (of the order of millimeters) from the gate lead, and a second clearance distance (for example, of the order of millimeters, as in the previous case greater than the first clearance distance because of the high voltage to which the tie bars are biased with respect to the lead gate) from the tie bars for preventing the occurrence of electric arc discharges between the gate lead, or the tie bars, and the heat-sink through the medium by which the electronic device is surrounded (e.g., air). The portion $230_{DX}$ should be positioned such as each part thereof (i.e., the base, the fins and the stabilizing elements of the portion $230_{DX}$) is placed at least at the first creepage distance from each gate lead, with such first creepage distance that in such case is substantially equal to a second creepage distance from the tie-bars 125 (since the latter are biased at the voltage of the source lead, the latter being typically substantially equal to the voltage at the gate lead—for avoiding the occurrence of surface electric discharges along the surfaces of the insulating body and/or the PCB). In addition, the heat-sink should comply with a first clearance distance (of the order of millimeters) from the gate lead, in this case equal to a second clearance distance—of the order of millimeters, because of the low voltage at which the tie-bars are biased with respect to the drain lead and hence to the parts of the portion $230_{DX}$ of the heat-sink that are electrically connected thereto—from the tie-bars for preventing the occurrence of electric arc discharges between the gate lead, or the tie-bars, and the heat-sink through the medium by which the electronic device is surrounded (e.g., air). For this reason, the distal portions of the rear stabilizing elements typically have a length greater than a length of the distal portions of the front stabilizing elements. In fact, the rear stabilizing elements, at the same electrical potential of the source lead, are close, in the case of the portion $230_{SX}$, to the drain track biased by the drain lead (that is usually at a very high voltage—for example, of the order of hundreds of Volts for a power transistor), whereas the rear stabilizing elements, at the same electrical potential of the drain lead, are close, in the case of the portion $230_{DX}$, to the source track biased by the source lead (that usually, analogously to the gate lead, is at a very smaller voltage—for example, of the order of hundreds of Volts for a power transistor—than the voltages at which the drain lead and the respective tracks on the PCB are biased).

As outlined in the description, the solution according to the present invention is not limited to systems wherein the electronic device is of the surface mounting technology (SMT) type; for example, the same considerations equivalently apply to systems comprising through-hole technology electronic devices.

The composite external heat-sink may be formed in any useful manner; for example, it may be obtained by connecting any number and type of tabs of the stabilizing elements to each other, or any number and type of end portions of the fins. Such connection may be indirect (i.e., through a connection element as visible in FIGS. 5-6), or direct.

Moreover, the electronic device may be used in any other electronic circuit (thus, not necessarily in switching circuits), such as for example electro-mechanical circuits.

What is claimed is:

1. A system, comprising:
an insulating body configured to embed at least one chip of semiconductor material in which at least one electronic component is integrated, the insulating body having a mounting surface for the mounting of the system on a board,
a first heat-sink connected to a conduction terminal of the at least one electronic component,
a second heat-sink connected to a further conduction terminal of the at least one component insulated from the conduction terminal,
wherein the first heat-sink and the second heat-sink are mounted on a free surface of the insulating body opposite the mounting surface,
an external heat-sink extending above the free surface, the external heat-sink comprising:
a first dissipative portion and a second dissipative portion configured to contact the first heat-sink and the second heat-sink on the free surface, respectively, and an insulating portion configured to electrically insulate the first dissipative portion from the second dissipative portion, the first dissipative portion and the second dissipative portion being symmetrical with respect to the insulating portion; and
a fixing base fixed on the free surface, and at least one stabilizing element extending from the fixing base beyond a contour of the insulating body, the at least one stabilizing element comprising a mounting portion configured to be fixed to the board.

2. The system according to claim 1, wherein the external heat-sink further comprises at least one fin having a proximal portion extending from the fixing surface substantially orthogonal to the free surface away from the insulating body, a folded distal portion substantially parallel to the free surface, and an end portion folded towards the free surface.

3. The system according to claim 2, wherein at least one of the at least one fin has a solid structure or with at least one air opening.

4. The system according to claim 2, wherein the fixing base is substantially square-shaped, wherein the at least one fin comprises three fins each one extending from a respective side of the fixing base, and wherein the at least one stabilizing element comprises a stabilizing element extending from the side of the fixing base not taken by any fin, said stabilizing element having a protruding portion extending on the free surface beyond a contour of the insulating body, and an intermediate portion connecting an end of the protruding portion to the mounting portion.

5. The system according to claim 4, wherein the at least one stabilizing element also comprises two further identical stabilizing elements facing towards opposite lateral faces of the insulating body, each one of said further stabilizing elements having a respective protruding portion extending orthogonal to the protruding portion of said stabilizing element, and a respective mounting portion mutually symmetric with respect to it.

6. The system according to claim 2, wherein the fixing base is substantially octagonal-shaped, wherein the at least one fin comprises a plurality of fins each one extending from a respective, not adjacent side of the mounting base, and wherein the at least one stabilizing element comprises a plurality of stabilizing elements each one extending from a respective side of the fixing base not taken by any fin.

7. The system according to claim 6, wherein at least one of said plurality of stabilizing elements comprises a further proximal portion extending from the fixing base transversal to the free surface away from the insulating body, a further portion substantially parallel to the free surface and protruding beyond the contour of the insulating body, and an intermediate portion transverse to the free surface extending vertically from an end of the protruding portion towards the mounting portion.

8. An arrangement including a first half-bridge and a second half-bridge configured to differentially drive a load, the arrangement comprising:
a first system for the first half-bridge,
a second system for the second half-bridge,
wherein each of the first and second system comprises:
an insulating body configured to embed at least one chip of semiconductor material in which at least one electronic component is integrated, the insulating body having a mounting surface for the mounting of the system on a board,
a first heat-sink connected to a conduction terminal of the at least one electronic component,
a second heat-sink connected to a further conduction terminal of the at least one component insulated from the conduction terminal,
wherein the first heat-sink and the second heat-sink are mounted on a free surface of the insulating body opposite the mounting surface,
an external heat-sink extending above the free surface, the external heat-sink comprising: a first dissipative portion and a second dissipative portion configured to contact the first heat-sink and the second heat-sink on the free surface, respectively, and an insulating portion configured to electrically insulate the first dissipative portion from the second dissipative portion, the first dissipative portion and the second dissipative portion being symmetrical with respect to the insulating portion,
wherein the external heat-sink of the first system is connected to the external heat-sink of the second system thereby forming a corresponding composite external heat-sink.

9. The arrangement according to claim 8, wherein said composite external heat-sink comprises at least one connection element configured to connect the external heat-sink of the first system to the external heat-sink of the second system, said connection element comprising a further insulating portion configured to connect the insulating portion of the first system to the insulating portion of the second system.

10. The arrangement according to claim 8, wherein at least one of the external heat-sinks comprises a fixing base fixed on the free surface, and at least one stabilizing element extending from the fixing base beyond a contour of the insulating body, the at least one stabilizing element comprising a mounting portion configured to be fixed to the board.

11. The arrangement according to claim 10, wherein the connection element forms said stabilizing element.

12. The arrangement according to claim 10, wherein at least one of the external heat-sinks comprises a fixing base fixed on the free surface and at least one fin having a proximal portion extending from the fixing surface substantially orthogonal to the free surface away from the insulating body, a folded distal portion substantially parallel to the free surface, and an end portion folded towards the free surface.

13. A system, comprising:
a package which embeds at least one integrated circuit chip, said package including a mounting surface and an opposed free surface, said package further including a first internal heat sink exposed on said free surface and a second internal heat sink exposed on said free surface, said first and second internal heat sinks being electrically insulated from each other by said package; and
an external heat-sink mounted above said free surface, the external heat-sink comprising:
a first thermally dissipative portion made of an electrically conductive material mounted in thermal and electrical contact with the first internal heat sink;
a second thermally dissipative portion made of an electrically conductive material mounted in thermal and electrical contact with the second internal heat sink; and
a third thermally dissipative portion made of a non-electrically conductive material mounted between the first thermally dissipative portion and the second thermally dissipative portion; and
a fixing base formed from the first, second and third thermally dissipative portions which is fixed on the free surface, and where each of the first and second thermally dissipative portions includes at least one stabilizing element extending from the fixing base beyond a contour of the package, said stabilizing element configured to be fixed to a board to which the mounting surface is also fixed.

14. The system of claim 13, wherein the first thermally dissipative portion and the second thermally dissipative portion have a symmetrical configuration about said third thermally dissipative portion.

15. The system of claim 13, wherein the external heat-sink comprises a fixing base formed from the first, second and third thermally dissipative portions which is fixed on the free surface, and where each of the first and second thermally dissipative portions includes at least one fin element extending upwardly away from the free surface.

16. The system of claim 15, wherein the fin element includes an air opening.

17. The system of claim 16, wherein the fin element includes a folded portion including an end oriented pointing towards the free surface.

18. The system of claim 13, wherein the external heat-sink comprises a fixing base formed from the first, second and third thermally dissipative portions which is fixed on the free surface, and further including a heat dissipative member extending from the fixing base upwardly away from the free surface, said heat dissipative member being formed from the first, second and third thermally dissipative portions.

19. The system of claim 13, wherein the external heat-sink comprises a fixing base formed from the first, second and third thermally dissipative portions which is fixed on the free surface, and further including at least one stabilizing element extending from the fixing base beyond a contour of the package, said stabilizing element being formed from the first, second and third thermally dissipative portions.

20. An arrangement, comprising:
a first integrated circuit with a first package including a mounting surface and an opposed free surface, said first package further including a first internal heat sink exposed on said free surface and a second internal heat sink exposed on said free surface, said first and second internal heat sinks being electrically insulated from each other by said first package;
a second integrated circuit with a second package including a mounting surface and an opposed free surface, said second package further including a third internal heat sink exposed on said free surface and a fourth internal heat sink exposed on said free surface, said third and fourth internal heat sinks being electrically insulated from each other by said second package; and
an external heat sink mounted to the free surfaces of the first and second packages, comprising:
a first thermally dissipative portion made of an electrically conductive material mounted in thermal and electrical contact with the first and third internal heat sinks;
a second thermally dissipative portion made of an electrically conductive material mounted in thermal and electrical contact with the second and fourth internal heat sinks; and
a third thermally dissipative portion made of a non-electrically conductive material mounted between the first thermally dissipative portion and the second thermally dissipative portion.

21. The arrangement of claim 20, wherein the external heat sink comprises
a first fixing base formed from the first, second and third thermally dissipative portions which is fixed on the free surface of first package;
a second fixing base formed from the first, second and third thermally dissipative portions which is fixed on the free surface of second package; and
an interconnecting portion formed from the first, second and third thermally dissipative portions extending between the first and second fixing bases.

22. The arrangement of claim 21, further comprising at least one stabilizing element extending from each of the first and second fixing bases beyond a contour of the first and second packages, respectively, said stabilizing element configured to be fixed to a board to which the mounting surfaces of the first and second packages are also fixed.

23. The arrangement of claim 22, wherein the stabilizing element is said interconnecting portion.

24. The arrangement of claim 21, wherein each of the first and second thermally dissipative portions includes at least one fin element extending upwardly away from the free surface.

\* \* \* \* \*